(12) United States Patent
Egawa

(10) Patent No.: US 8,970,751 B2
(45) Date of Patent: Mar. 3, 2015

(54) SOLID-STATE IMAGING DEVICE

(75) Inventor: Yoshitaka Egawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 357 days.

(21) Appl. No.: 13/603,289

(22) Filed: Sep. 4, 2012

(65) Prior Publication Data

US 2013/0181114 A1 Jul. 18, 2013

(30) Foreign Application Priority Data

Jan. 12, 2012 (JP) ................................. 2012-004054

(51) Int. Cl.
*H04N 3/14* (2006.01)
*H04N 5/335* (2011.01)

(52) U.S. Cl.
USPC ........................................ 348/294; 250/208.1

(58) Field of Classification Search
USPC ........................................ 250/208.1; 348/294
See application file for complete search history.

(56) References Cited

U.S. PATENT DOCUMENTS

2013/0182155 A1* 7/2013 Egawa ........................... 348/294

FOREIGN PATENT DOCUMENTS

| JP | 2007-259232 | 10/2007 |
|---|---|---|
| JP | 2007-318002 | 12/2007 |
| JP | 2008-060323 | 3/2008 |

* cited by examiner

*Primary Examiner* — Thanh Luu
*Assistant Examiner* — Renee D Chavez
(74) *Attorney, Agent, or Firm* — Patterson & Sheridan, LLP

(57) ABSTRACT

According to one embodiment, an image sensor, which is a solid imaging device, includes a photoelectric conversion element array, a condensing optical element array, filter and reflector units, and a reflective unit. The reflective unit further reflects a light reflected by the filter and reflector units. The condensing optical element is arranged so that it contains a first photoelectric conversion element and a portion of a second or a third photoelectric conversion element, which are adjacent to the first photoelectric conversion element. The arrangement of the photoelectric conversion elements may comprise a cell. The reflective unit includes at least a first reflective surface and a second reflective surface. The first reflective surface is opposite to the filter and reflector units. The second reflective surface surrounds the filter and reflector units and the first reflective surface for each cell.

20 Claims, 17 Drawing Sheets

SOLID-STATE IMAGING DEVICE

CROSS-REFERENCE TO RELATED APPLICATION

This application is based upon and claims the benefit of priority from Japanese Patent Application No. 2012-004054, filed Jan. 12, 2012; the entire contents of which are incorporated herein by reference.

FIELD

Embodiments described herein relate to a solid-state imaging device.

BACKGROUND

In recent years, there is an increasing demand for smaller built-in camera modules for use in mobile phones, laptop computers, electronic tablets, etc. These camera modules use an image sensor to detect light and convert the detected light into a signal that is used to produce an image. Miniaturization of the image sensor in these camera modules requires decreasing the size of the pixel(s) while increasing the number of pixels in order to maintain an acceptable quality in the produced image. However, decreasing the size of the pixel reduces the amount of signals from the image sensor. Further, the miniaturization of a pixel reduces the light volume available to the pixel, and the reduced light volume that enters into a pixel causes a greater degradation of the signal to a point where signal-to-noise ratio (SNR) becomes a problem. The goal is to attain high sensitivity by improving light utilization efficiency.

Some conventional image sensors include a single photoelectric conversion element that detects all colors of light and synthesizes a color image therefrom through color reproduction by interpolation methods. Other conventional image sensors use color filters which absorb wavelengths that are not recognized by the photoelectric conversion element, and the absorbed wavelengths that are not recognized do not contribute to the reproduction of the image. This results in inefficient light utilization which may decrease the resolution the image. In other conventional image sensors, multiple dichroic mirrors are placed in the path of incident light, which results in enhanced color sensing by the image sensor. However, manufacture of these types of image sensors is very expensive. Additionally, the wavelength characteristics of the dichroic mirrors largely depend on the incidence angle of incoming light, which may cause the half wave length in the spectral characteristic to shift by several ten nanometers due to a difference in the incidence angle. The difference in the spectral characteristics is further exaggerated because the dichroic mirrors have different wavelength characteristics, which causes a degradation of the color reproduction. In addition, due to light polarization in the dichroic mirror, the transmission and the reflection characteristics differ greatly due to the presence of parallel (P) waves at the incident surface and perpendicular (S) waves at the incident surface. The presence of these waves causes the color separation characteristics to degrade.

What is needed is an image sensor having greater color sensitivity and improved optical efficiency that is less expensive to manufacture.

DETAILED DESCRIPTION

Figure 1:
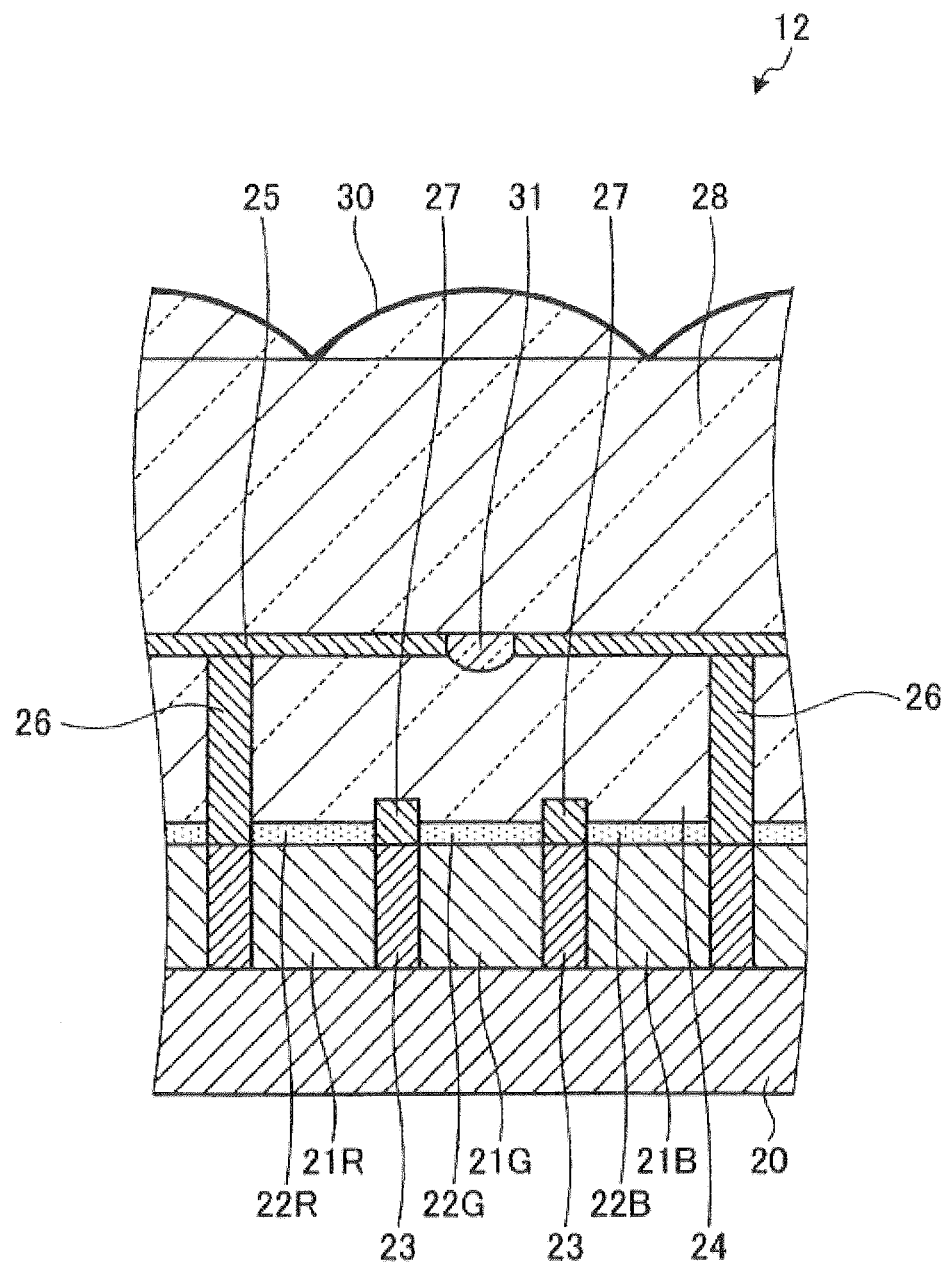
FIG. 1 is a schematic cross-sectional view of a portion of a solid-state image sensor according to one embodiment.

According to the embodiments described herein, there is provided a solid-state imaging device that provides high-sensitivity photography with good color separation and high light-use efficiency, and may be produced with a reduction of manufacturing cost.

In general, according to one embodiment of the present embodiment, a solid-state imaging device has a photoelectric conversion element array, a condensing optical element array, a wavelength-sensitive filter and reflector, and a reflective unit. The photoelectric conversion element array is provided with at least the photoelectric conversion elements for a first wavelength range that may correspond with a first color of light, the photoelectric conversion elements for a second wavelength range that may correspond with a second color of light, and the photoelectric conversion elements for a first wavelength range that may correspond with a third of color light. The photoelectric conversion element for the first color of light detects the first color of light. The photoelectric conversion element for the second color of light detects the second color of light. The photoelectric conversion element for the third color of light detects the third color of light. The condensing optical element array is positioned on a light-incident side of the photoelectric conversion element array. The condensing optical element array is provided with a condensing optical element. The condensing optical element focuses the light. The wavelength-sensitive filter and reflector unit transmits specific wavelength ranges of light to be detected by a dedicated photoelectric conversion element that detects the specific wavelength range, and reflects other wavelength ranges of light to other photoelectric conversion elements that are dedicated to detection of other wavelength ranges of light. The reflective unit further reflects the light reflected by the wavelength-sensitive filter and reflector unit. The photoelectric conversion element array is configured by forming a Bayer array, which uses a cell as a unit. The cell contains the photoelectric conversion elements for the first color of light, for the second color of light, and for the third color of light. The condensing optical element is arranged in a range containing the photoelectric conversion element for the first color of light, and a portion of each of the photoelectric conversion elements for the second color of light and for the third color of light, which adjoins the photoelectric conversion element for the first color of light. The reflective unit includes the first reflective surface and the second reflective surface, at least. The first reflective surface is opposite to the filter and reflector unit. The second reflective surface surrounds the filter and reflector unit and the first reflective surface for every cell.

Regarding one embodiment, with reference to the accompanying drawing, the solid-state imaging device concerning an embodiment is explained in detail below. In addition, the present embodiment is not limited by these embodiments.

(First Embodiment)

FIG. 1 is a schematic profile of a portion of an image sensor 12, which is a solid-state imaging device according to the first embodiment.

Figure 2:
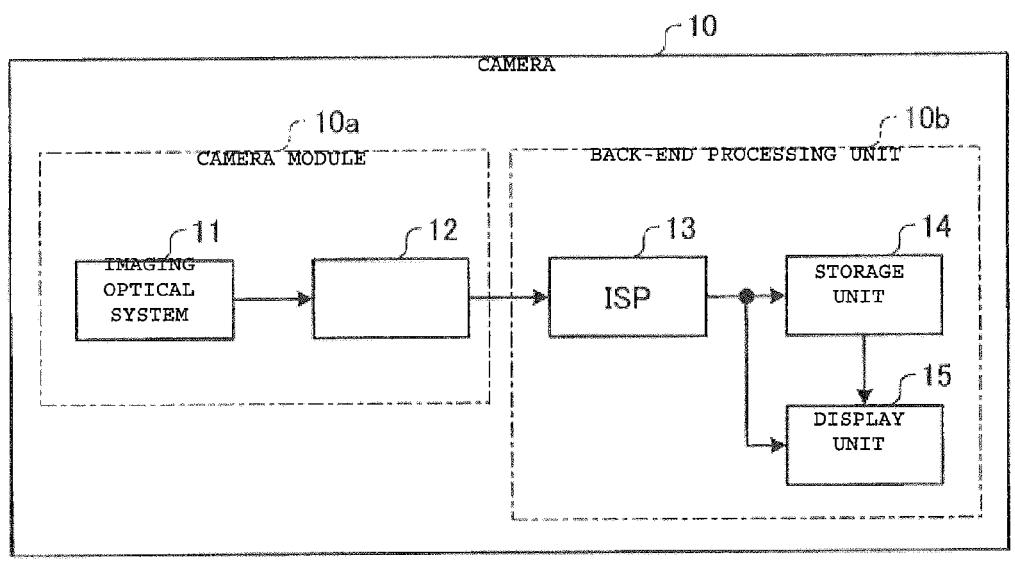
FIG. 2 is a block diagram showing a schematic configuration of a camera to which the solid-state image sensors as described herein may be used.

FIG. 2 is a block diagram showing a schematic configuration of a camera to which the image sensors as described herein may be used.

A camera 10 has a camera module 10a and a post-processing unit 10b. The camera module 10a has an imaging optical system 11 and an image sensor 12. The post-processing unit 10b has an image signal processor (ISP) 13 and a storage unit 14 and a display unit 15. The camera 10 is a digital camera, for example. The camera module 10a is used, for example, with electronic devices, such as a digital camera or a portable digital device with a camera.

The imaging optical system 11 takes in the light from a subject image, provides the light to the image sensor 12, which provides signals based on the light from the subject image. ISP 13 carries out signal processing of the image signal acquired by imaging with the image sensor 12. The storage unit 14 stores the image processed by ISP 13. The storage unit 14 outputs an image signal to the display unit 15, based on a user's operation, etc. The display unit 15 displays an image based on the image signal input from ISP 13 or the storage unit 14. The display unit 15 is a liquid crystal display, for example.

The image sensor 12 has a photoelectric conversion element array. The photoelectric conversion element array has plural photoelectric conversion elements 21R (red), 21G (green), and 21B (blue) arranged in the shape of an array. The photoelectric conversion elements 21R, 21G, and 21B are N-type photodiodes, for example, and are formed in a P-type semiconductor substrate 20.

The photoelectric conversion element 21G detects wavelength ranges corresponding to G light. The photoelectric conversion element 21G is a photoelectric conversion element for G light, which is a first color of light. The photoelectric conversion element 21B detects wavelength ranges corresponding to B light. The photoelectric conversion element 21B is a photoelectric conversion element for B light, which is a second color of light. The photoelectric conversion element 21R detects wavelength ranges corresponding to R light. The photoelectric conversion element 21R is a photoelectric conversion element for R light, which is a third color of light.

The photoelectric conversion elements 21R, 21G, and 21B generate an electric charge based on the volume of incident light. The photoelectric conversion elements 21R, 21G, and 21B detect distinct colors of light. The image sensor 12 may be a CMOS sensor, for example. The image sensor 12 shall be applicable to any type of front-illumination CMOS sensor and back-illumination CMOS sensor.

A filter and reflector unit 22G is provided on a light-receiving surface of the photoelectric conversion element 21G. The filter and reflector unit 22G transmits the wavelength ranges corresponding to G light, which is the color of light detected by the photoelectric conversion element 21G, and reflects R light and B light. The filter and reflector unit 22G is a color filter for the first color of light.

A filter and reflector unit 22B is provided on a light-receiving surface of the photoelectric conversion element 21B. The filter and reflector unit 22B transmits the wavelength ranges corresponding to B light, which is color of light detected by the photoelectric conversion element 21B, and reflects R light and G light. The filter and reflector unit 22B is a color filter for the second color of light.

A filter and reflector unit 22R is provided on a light-receiving surface of the photoelectric conversion element 21R. The filter and reflector unit 22R transmits the wavelength ranges corresponding to R light, which is color of light detected by the photoelectric conversion element 21R, and reflects G light and B light. The filter and reflector unit 22R is a color filter for the third color of light.

The filter and reflector units 22R, 22G, 22B selectively transmit or reflect the different colors of light to the dedicated R, G and B photoelectric conversion elements 21R, 21G, 21B by light transmission and reflection of each color in the incident light. The filter and reflector units 22R, 22G, 22B, are composed, for example, of pearl pigment, a photonic crystal (nano structure), or a dichroic filter. The filter and reflector units 22R, 22G, 22B that are formed using pearl pigment make use of the thin-film optical interference effects by uniformly coating nano-size fine titanium oxide particles on the substrate and controlling the thickness of the coating layer. The filter and reflector units 22R, 22G, 22B that are formed using a dichroic filter, use a multilayer film that is provided on a surface of the pigment.

A separation and reflection unit 23 is a barrier that separates the adjacent photoelectric conversion elements 21R, 21G, and 21B. The separation and reflection unit 23 maintains separation of the light within the photoelectric conversion elements 21R, 21G, and 21B. For the separation and reflection unit 23, a deep-trench structure used for DRAM, etc., is adopted, for example.

A micro lens array is formed on a surface where the light is incident from the imaging optical system 11 (of the camera module 10a shown in FIG. 2) of the image sensor 12. The micro lens array has multiple micro lenses 30, which are arranged in an array. The micro lens 30 functions as a condensing optical element that focuses the incident light from the imaging optical system 11. The micro lens array functions as a condensing optical element array arranged on the light-incident side of the micro lens array that transmits light towards the photoelectric conversion element array. Each micro lens 30 of the array, for example, is designed to focus the light on the light-receiving surface of the photoelectric conversion element 21G.

A first reflection unit 25, a second reflection unit 26 and the third reflection unit 27 function as a reflection unit that further reflects the light reflected by the filter and reflector units 22R, 22G, and 22B. The first reflection unit 25 forms a first reflecting surface opposite to the filter and reflector units 22R, 22G, and 22B. In the first reflecting surface, an opening to pass the light from each micro lens 30 is provided.

The opening is located between the center position of each micro lens 30 and the center position of the photoelectric conversion element 21G. The solid portion of first reflecting unit 25 functions as a shielding layer for shielding the light traveling toward the photoelectric conversion element array from the micro lens array. An inner-layer lens 31 is formed in the opening of the first reflection unit 25. The inner-layer lens 31 functions as a collimator for focusing light from each micro lens 30.

Figure 3:
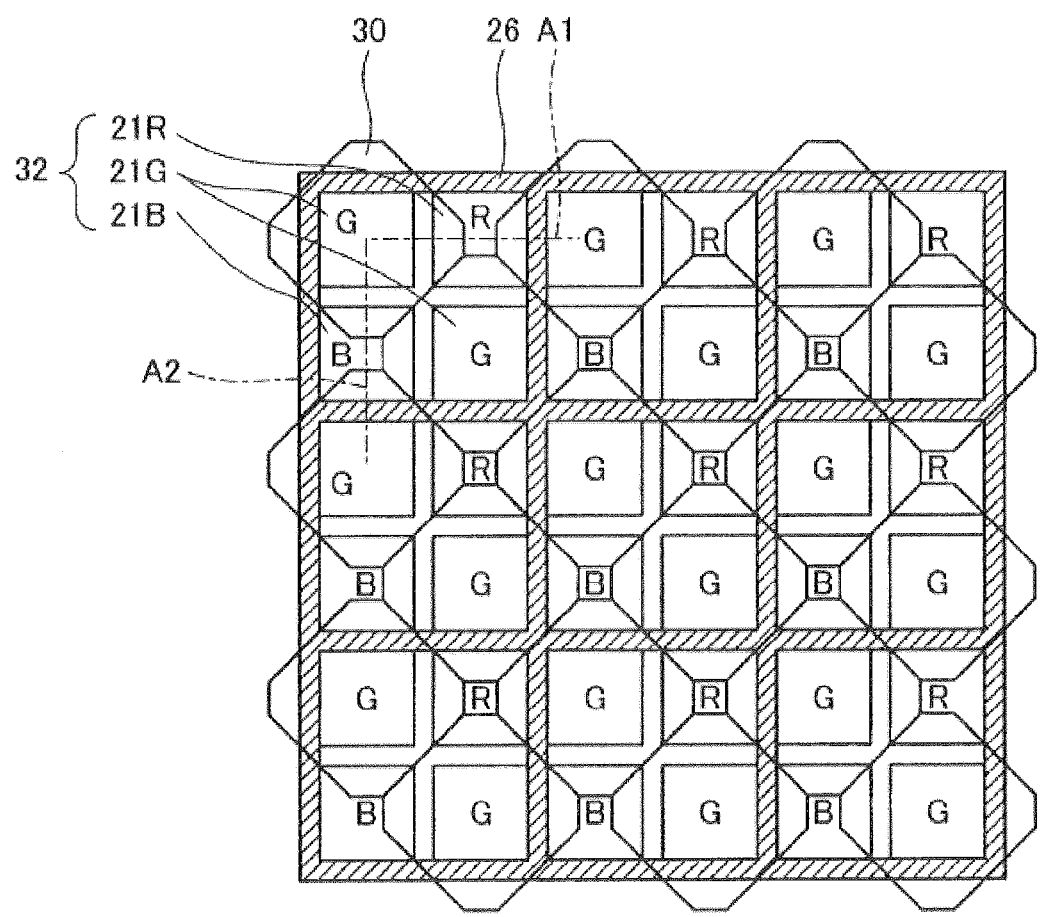
FIG. 3 is a schematic plan view of one embodiment a micro lens array, a second reflective unit, and a photoelectric conversion element array.

FIG. 3 is a schematic diagram of a plan view a the micro lens array, a second reflection unit, and an array of photoelectric conversion elements. Here, we have shown the micro lens array in the case of seeing image sensor 12 from the light-incident side, a second reflecting unit 26, and a photoelectric conversion element array being located below the micro lens array.

The vertical direction in FIG. 3 is the row direction, and the left-right direction in FIG. 3 is the column direction. The dashed line A1 shows the alignment between the center positions of the photoelectric conversion elements 21R and 21G, which adjoin in the row direction. The dashed line A2 shows the alignment between the center positions of the photoelectric conversion elements 21G and 21B, which are adjacent in the column direction. The cross-section shown in FIG. 1 corresponds to a sectional view of FIG. 3 in the cutting plane of dashed line A1 and the cutting plane of dashed line A2 combined, and folded open around the vertex of intersection of the two dashed lines A1 and A2 into a common plane, viewed from the left of, and toward the top of, the page direction from, the vertex.

The photoelectric conversion element array is constituted by forming the photoelectric conversion elements 21R and 21G into a Bayer array. The Bayer array uses the four photoelectric conversion elements 21G, 21R, 21B, plus an array of two rows and two columns formed by 21G as a unit. Thus, a cell 32 is comprised of the four photoelectric conversion elements 21G, 21R, 21B, plus the combination of 21G, which are the units of the Bayer array.

As for the micro lens array, each micro lens 30 is arranged so that the position of the photoelectric conversion element 21G is located in the center of each micro lens 30. The microlens 30 is arranged so that it contains the light-receiving surface of the photoelectric conversion element 21G in the center, and a portion of each of the light-receiving surfaces of the four photoelectric conversion elements, 21B, 21R, 21R, and 21B, which are adjacent the photoelectric conversion element 21G in the column direction and row direction to the photoelectric conversion element 21G. The plane shape of the micro lens 30 forms the area for about two pixels.

The micro lens 30 is forming a square array that is offset about 45 degrees relative to the cell 32. As shown, each micro lens 30 forms a substantial octagon, which almost has four corners that are squared, for example. In another example, each micro lens 30 may be a substantial square or a substantial round shape. Other examples of the micro lens 30 include a square shape with the four corners of each micro lens 30 slightly rounded, a diamond shape, etc., as an alternative to the octagon shape.

Referring again to FIG. 1, a first transparent layer 24 is provided between the first reflecting unit 25, and the filter and reflector units 22R, 22G, 22B. The first transparent layer 24 transmits the incident light. The second reflecting unit 26 forms the second reflecting surface that surrounds the first transparent layer 24 in each cell 32 between filter and reflector units 22R, 22G, and 22B and the first reflecting unit 25. The second reflecting unit 26 forms the side wall that separates the first transparent layer 24 of each cell 32. The second reflecting unit 26 forms the shell of the cell 32. Walls of the second reflecting unit 26 are shared by adjacent cells 32 and bounds each cell 32.

In the cross-section shown in FIG. 1, one end of the second reflection unit 26 is joined to the first reflection unit 25. The end of the second reflection unit 26 opposite to the end of the second reflection unit 26 coupled to the first reflection unit 25 is joined to the separation and reflection unit 23 at a position that separates the cell 32.

A third reflection unit 27 is formed on the separation and reflection unit 23. The third reflection unit 27 separates the adjacent filter and reflector units 22R, 22G, and 22B. The third reflection unit 27 constitutes a third reflective surface, which reflects the light that travels between the filter and reflector units 22R, 22G, and 22B.

The first transparent layer 24 is completely surrounded in the three-dimensions by the filter and reflector units 22R, 22G, and 22B, the first reflecting unit 25, the second reflection reflecting unit 26, and the third reflection unit 27, except for the portion where the inner-layer lens 31 is provided.

The first reflection unit 25, the second reflection unit 26, and the third reflection unit 27 are composed of a highly reflective component, for example, metal components, such as aluminum, etc., or silicon dioxide ($SiO_2$) with a low optical, low refractive index, etc. Moreover, the configuration of a reflection unit is not limited to the case described in the present embodiment, and can be changed. For example, a reflective unit can be made of the first reflection unit 25 and the second reflection unit 26, and omits the third reflective part 27. Moreover, the first reflection unit 25, the second reflection unit 26, and the third reflection unit 27 may change form.

A second transparent layer 28 is provided between the micro lens array and the first reflecting unit 25. The second transparent layer 28 transmits the light from the micro lens 30 to the inner-layer lens 31. The first transparent layer 24 is composed of a transparent material such as titanium dioxide ($TiO_2$) with a high optical refractive index. The second transparent layer 28 is composed of a transparent material, such as a transparent silicon oxide ($SiO_2$), with a low optical refractive index.

Figure 4:
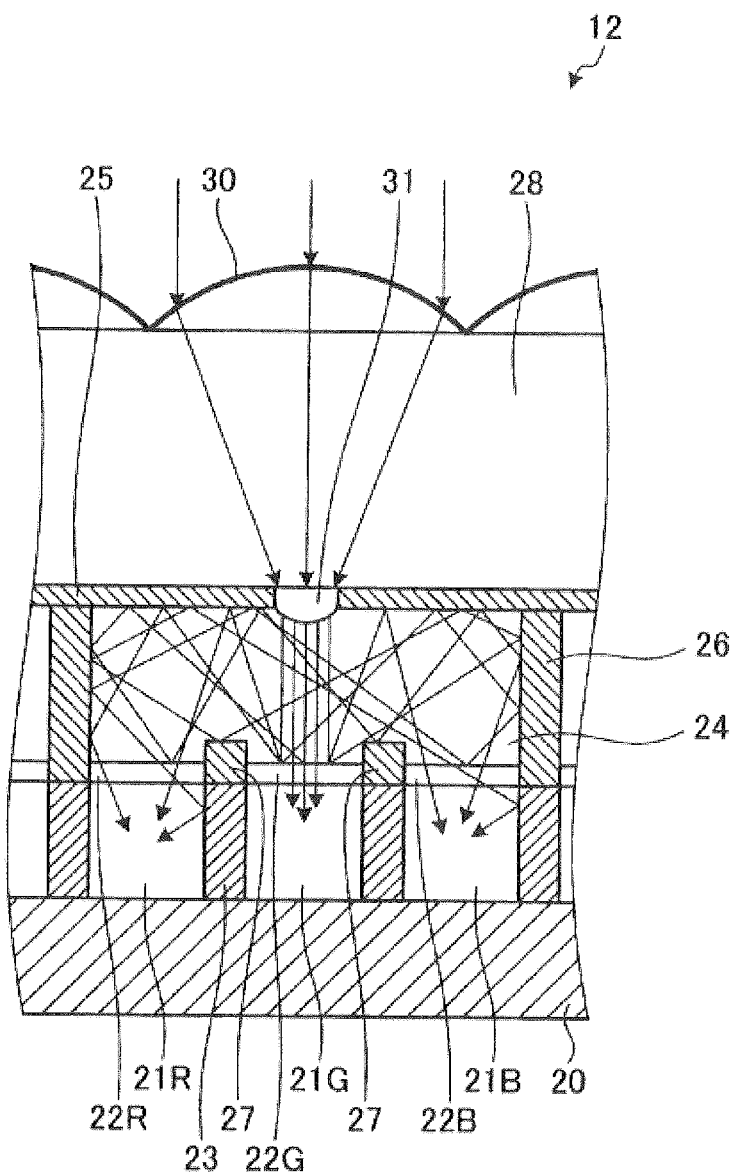
FIG. 4 is a diagram showing an example of the behavior of light that enters the image sensor.

FIG. 4 is a schematic diagram showing an example of the behavior of the incident light in the image sensor. The micro lens 30 converges the incident light from the imaging optical system 11 to the inner-layer lens 31. The inner-layer lens 31 collimates the light from the micro lens 30. The light emitted from the inner-layer lens 31 goes straight through the inside of the first transparent layer 24 towards the filter and reflector unit 22G. The image sensor 12 can efficiently separate the color light in the filter and reflector unit 22G by aligning the direction of movement of the light so that the light may enter almost perpendicularly from the inner-layer lens 31 to the filter and reflector unit 22G.

The filter and reflector unit 22G transmits the G component of the incident light and reflects the R component and the B component. The G light transmitted from the filter and reflector unit 22G is changed into an electric charge by the photo-electric conversion element 21G. The light reflected by the filter and reflector unit 22G travels further in the first transparent layer 24. The first reflecting unit 25, the second reflecting unit 26, and the third reflecting unit 27 reflect the incident light, and it then advances further into the first transparent layer 24.

The filter and reflector unit 22R transmits the R component of the incident light and reflects the G component and B component. The R light transmitted from the filter and reflector unit 22R is changed into an electric charge by the photoelectric conversion element 21R. The light reflected by the filter and reflector unit 22R then travels further in the first transparent layer 24.

The filter and reflector unit 22B transmits the B component of the incident light and reflects the R component and G component. The B light transmitted from the filter and reflector unit 22B is changed into an electric charge by the photoelectric conversion element 21B. The light reflected by the filter and reflector unit 22B then travels further in the first transparent layer 24.

Light that is near parallel relative to the light-receiving surface of photoelectric conversion elements 22R, 22G, and 22B is reflected by the separation reflective unit 23, which suppresses the penetration of light to the adjacent photoelectric conversion elements 21R, 21G, and 21B. The image sensor 12 can control the mixing of colors by controlling the leakage of the light between the photoelectric conversion elements 21R, 21G, and 21B which are adjacent each other, by the separation and reflection unit 23.

The filter and reflector units 22R, 22G, and 22B, which are prepared in the image sensor 12, can be easily manufactured using the same process as the color filter prepared in the light-receiving surface of a conventional photoelectric conversion element. The manufacturing cost of the image sensor 12 can be reduced by adopting filter and reflector units 22R, 22G, and 22B as the configuration for a color discriminating filter.

The image sensor 12 temporarily reflects the colors of lights other than the colors of light transmitted to photoelectric conversion elements 21R, 21G, and 21B by filter and reflector units 22R, 22G and 228, and directs the reflected light to the other photoelectric conversion elements 21R, 21G, and 21B dedicated for the component of light. The image sensor 12 can improve the light use efficiency, as compared to adopting the system of color separation that absorbs the colors of lights other than the colors of light directed to the photoelectric conversion elements 21R, 21G, and 21B by a color filter. Furthermore, image sensor 12 can obtain the R, G, and B signals with reduced dependence on incident-angle and provide good color reproducibility.

The image sensor 12 is provided with a reflection unit that surrounds the first transparent layer 24 for each cell 32, and reflects the light temporarily reflected by filter and reflector units 22R, 22G, and 22B by the reflection unit. The image sensor 12 promotes effective use of light by directing the light temporarily reflected by filter and reflector units 22R, 22G, and 22B to filter and reflector units 22R, 22G, and 22B by using the reflection in the reflection unit.

The human eye's peak sensitivity to the spectrum of visible light is considered to be near green, which is located in the middle region of the wavelength bands of visible light. In each component of the RGB, the G component will significantly influence the appearance of the image. The image sensor 12 reduces the loss, especially of G light, by arranging the photoelectric conversion element 21G in the position which makes light go straight on from the micro lens 30. By maintaining the resolution and signal-to-noise (SNR) ratio of the G component at a high level by reduction of the loss of the G light, it is possible for the image sensor 12 to realize high resolution and low noise.

Figure 5:
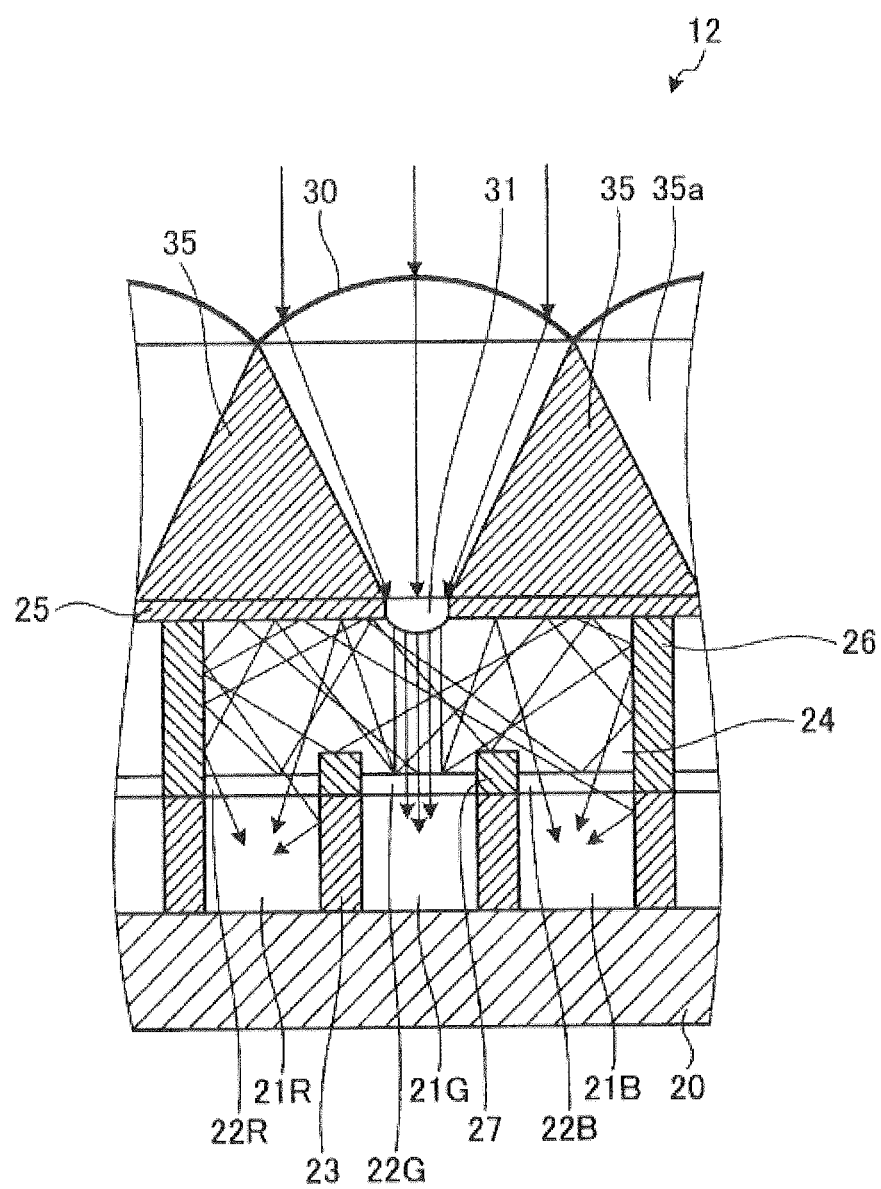
FIG. 5 is a cross-sectional view of a portion of a solid-state image sensor according to another embodiment.

FIG. 5 is a cross-sectional view a portion of a solid-state image sensor according to another embodiment. A fourth reflection unit 35 is provided between the micro lens 30 and the first reflection unit 25. A third transparent layer 35a forms a pyramid gradually narrowed in a conical shape from the micro lens 30 toward the opening in the first reflection unit 25.

The fourth reflection unit 35 occupies portions other than the portion in which the third transparent layer 35a is provided among the layer portions between the micro lens 30 and the first reflection unit 25. The fourth reflection unit 35 constitutes a fourth reflection surface, which reflects the light that travels from the micro lens 30 in the direction of the inner-layer lens 31 between the micro lens 30 and the first reflection unit 25.

The fourth reflection unit 35 is composed of metal components, such as a high-reflective metals, for example, aluminum, etc., or silicon dioxide ($SiO_2$) with a low optical refractive index, etc. The third transparent layer 35a is composed of titanium dioxide ($TiO_2$) with a high optical refractive index, etc. The reflective component of the fourth reflection unit 35 need not fill the space between the third transparent layer 35a of the fourth reflection unit 35. As for the fourth reflection unit 35, an interface with at least the third transparent layer 35a component may be configured by the highly-reflective component. The fourth reflection unit 35 may be formed as part of the first reflection unit 25 to be integrated with the first reflection unit 25.

The light that travels from the micro lens 30 is directed to the inner-layer lens 31 by reflection in the fourth reflection unit 35. By application of the fourth reflection unit 35, the image sensor 12 can direct the light from the micro lens 30 to the inner-layer lens 31 efficiently and can increase light use efficiency.

Figure 6:
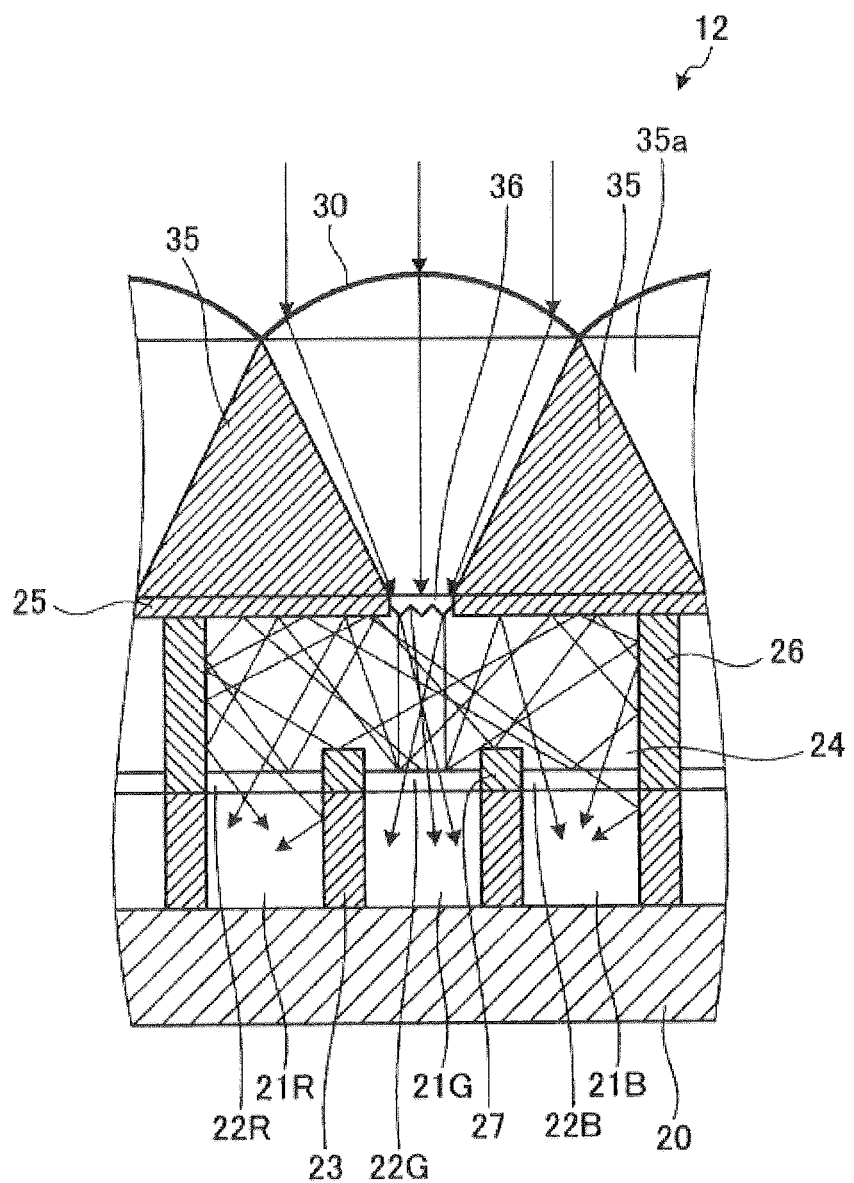
FIG. 6 is a cross-sectional view of a portion of a solid-state image sensor according to another embodiment.

FIG. 6 is a cross-sectional view of a portion of a solid-state image sensor according to another embodiment. A diffusion unit 36 is replaced with the inner-layer lens 31, and is prepared in the opening of the first reflection unit 25. The diffusion unit 36 diffuses the light that is condensed with the micro lens 30. The diffusion degree of the diffusion unit 36 is set so that light may spread to a degree to cover the entire area of the filter and reflector unit 22G.

The component reflected by the filter and reflector unit 22G by directing light to the filter and reflector unit 22G through diffusion in the diffusion unit 36 will be further diffused by the filter and reflector unit 22G. The emission of the light from the opening to the third transparent layer 35a side can be controlled in this modification by effectively diffusing the light of the component reflected by the filter and reflector unit 22G in a direction away from the opening of the first reflection unit 25. For example, the diffusion unit 36 is manufactured by forming a triangular pyramid structure using titanium dioxide ($TiO_2$) with a high optical refractive index.

Figure 7:
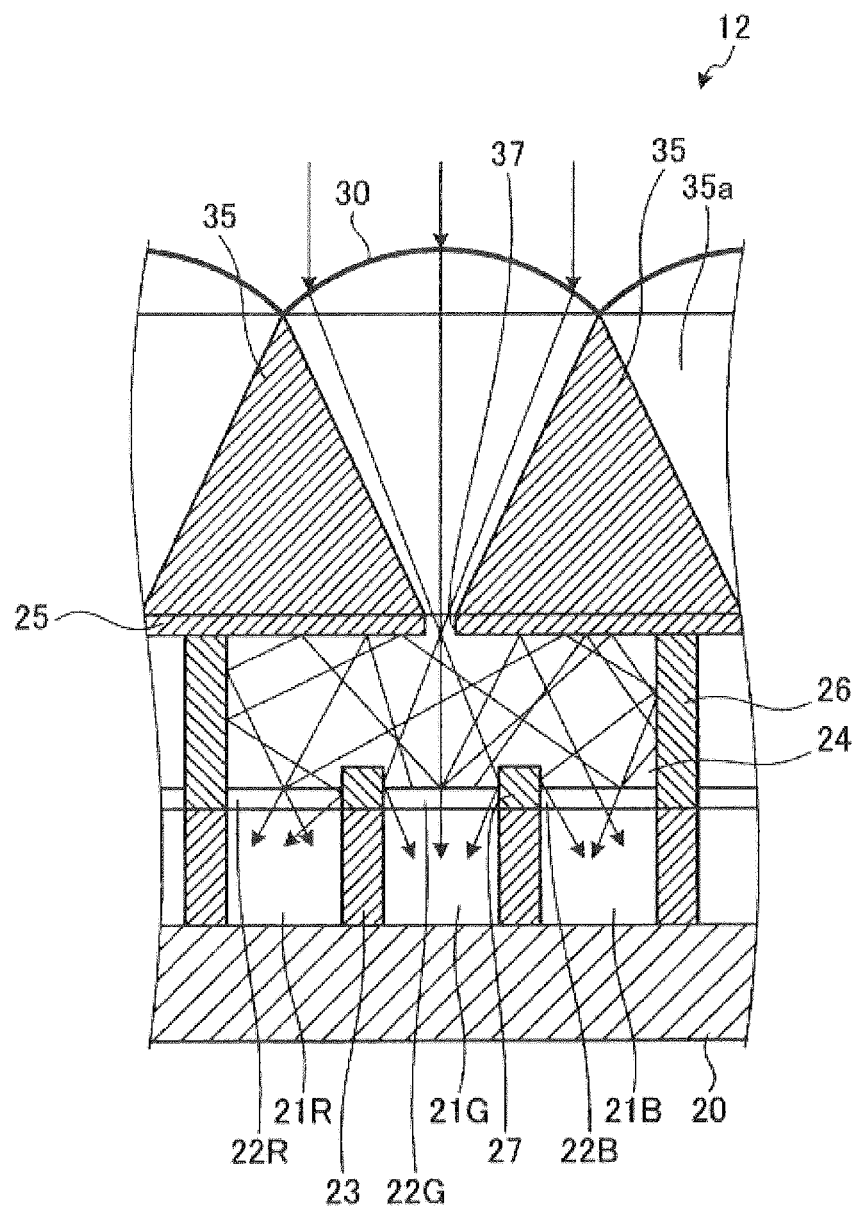
FIG. 7 is a cross-sectional view of a portion of a solid-state image sensor according to another embodiment.

FIG. 7 is a cross-sectional view of a portion of a solid-state image sensor according to another embodiment. The micro lens 30 converges light near an opening 37 of the first reflection unit 25. An optical element need not be positioned in the opening 37. The light that converges in the vicinity of the opening 37 is focused to the aperture. The condensing degree of micro lens 30 is set so that the light that temporarily converges may then spread along the same angular spread that it was converged from lens 30 such that it initially is received over the full area of the filter and reflector unit 22G.

This modification can effectively diffuse the light of the components of the light that are reflected by the filter and reflector unit 22G in a direction away from the opening 37, and can control the transmission of the light reflected from the filter and reflector unit 22G into the opening 37 to the third transparent layer 35a side. By omitting the optical element in the opening 37, it is possible for the image sensor 12 to reduce the part size, parts count, and cost of the manufacturing process by omitting the optical element in the opening 37.

In addition, in the embodiments of FIGS. 6 and 7, the image sensor 12 is provided with the same fourth reflection unit 35 as described in FIG. 5. Alternatively, the image sensor 12 may not include the fourth reflection unit 35 in the embodiments described in FIGS. 6 and 7, which may be similar to the embodiment of FIG. 1.

Figure 8:
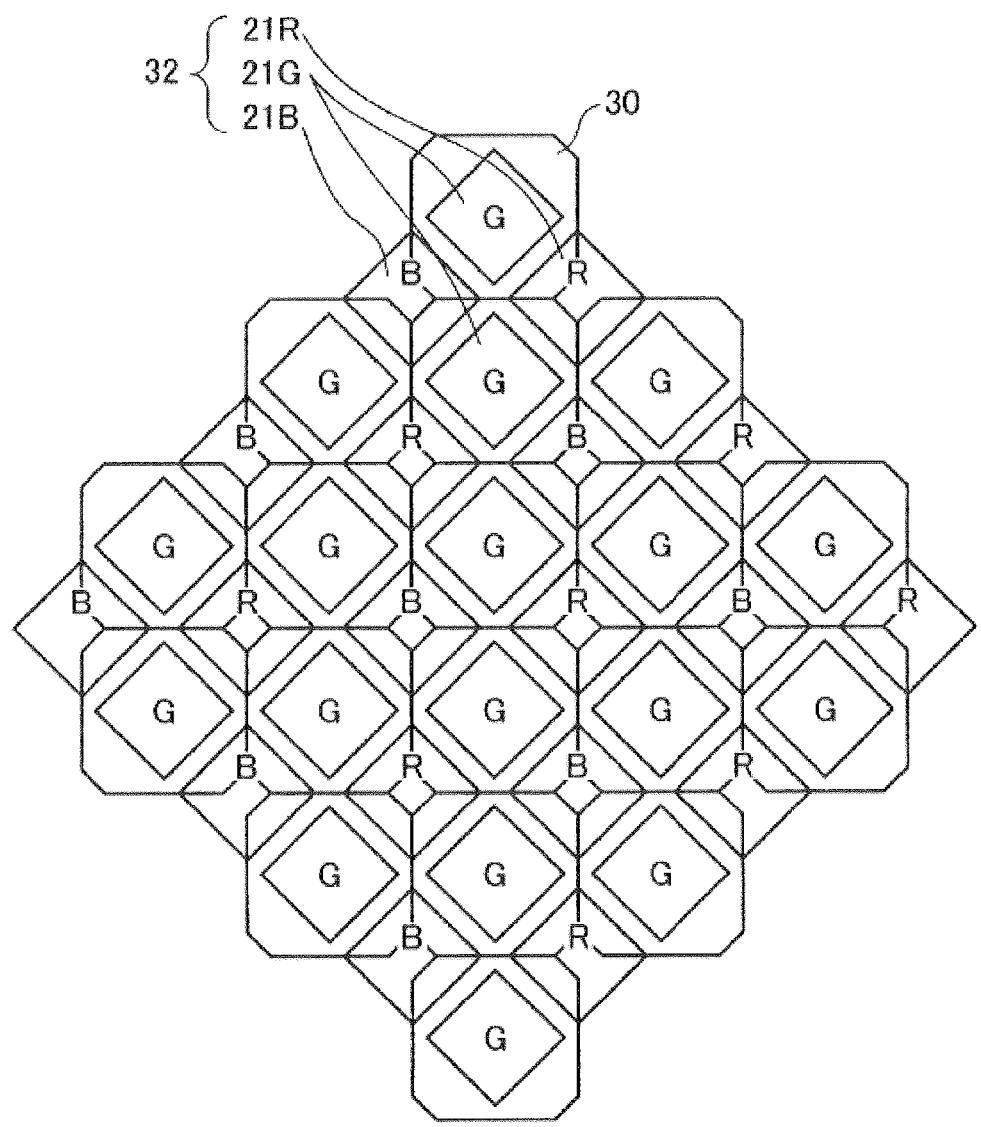
FIG. 8 is a plan view showing another embodiment of a micro lens array and a photoelectric conversion element array.

In this embodiment, it is possible to change the form of the configuration of the micro lens array and a photoelectric conversion element array shown in FIG. 3. FIG. 8 is a diagram showing a modification of the micro lens array and a photoelectric conversion element array. In this modification, the micro lens array and the photoelectric conversion element array are shifted 45 degrees from what is shown in FIG. 3. The micro lens 30 forms the square array. The photoelectric conversion elements 21R, 21G and 21B form the array, which is tilted 45 degrees from the square photoelectric conversion element array.

Even when the micro lens 30 and the photoelectric conversion element 21R, 21G, 21B have been arranged as in this modification, the image sensor 12, as in the case of the array shown in FIG. 3, can obtain high-quality images. Moreover, the ISP 13 (refer to FIG. 2) can facilitate the signal processing by making it possible to read out the signal sequentially from the line arranged by the photoelectric conversion element 21G and the line arranged by the alternating photoelectric conversion elements 21R and 21B into the image sensor 12.

(Second Embodiment)

Figure 9:
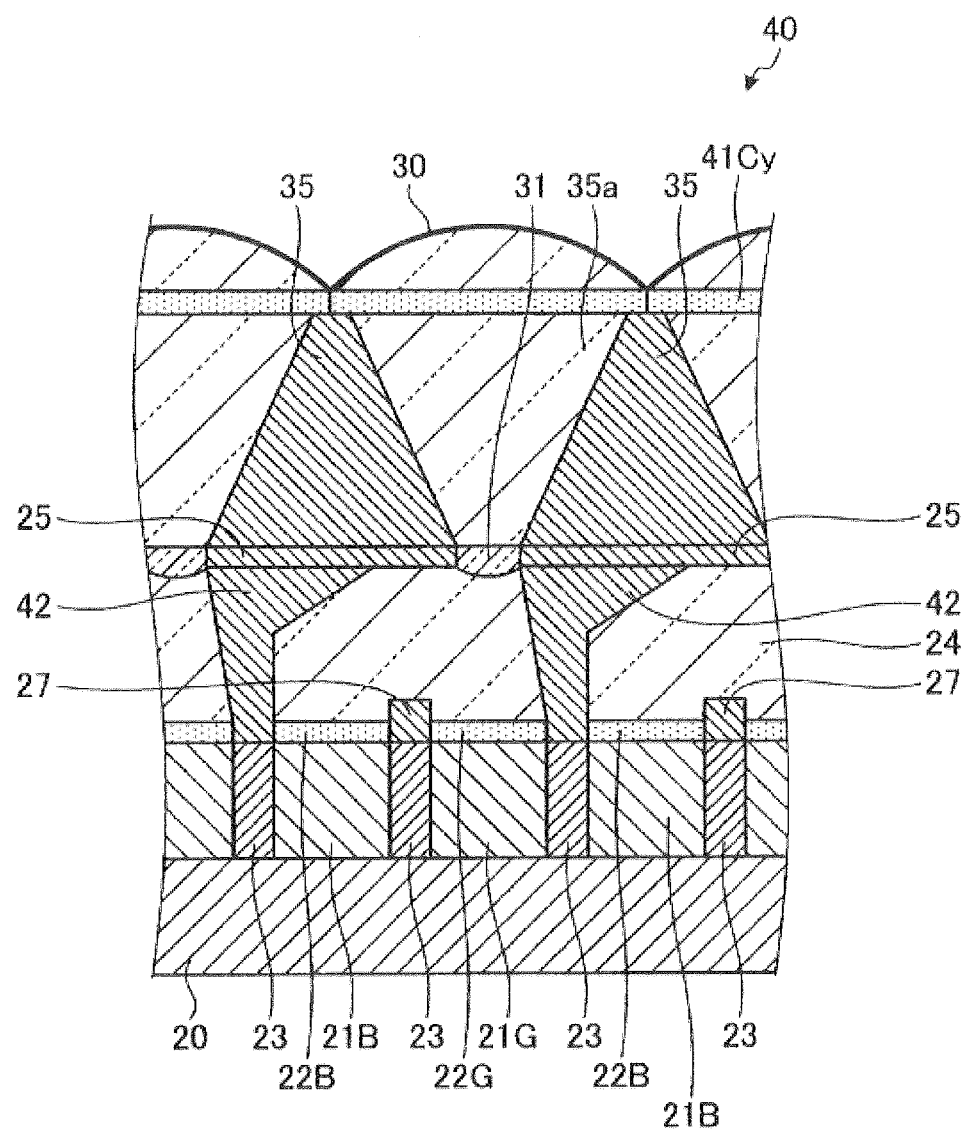
FIG. 9 is a cross-sectional view of a portion of a solid-state image sensor according to another embodiment.
Figure 10:
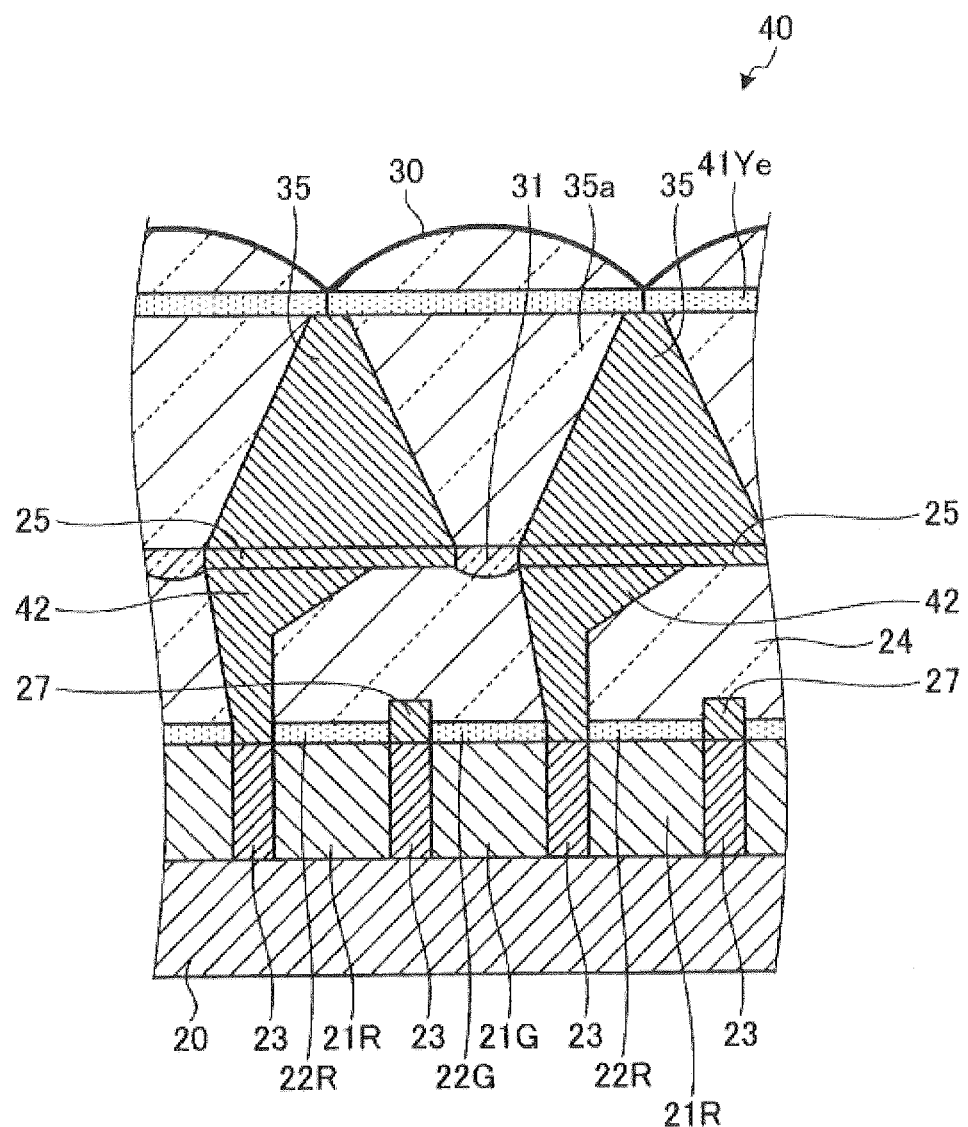
FIG. 10 is a cross-sectional view of a portion of a solid-state image sensor according to another embodiment.
Figure 11:
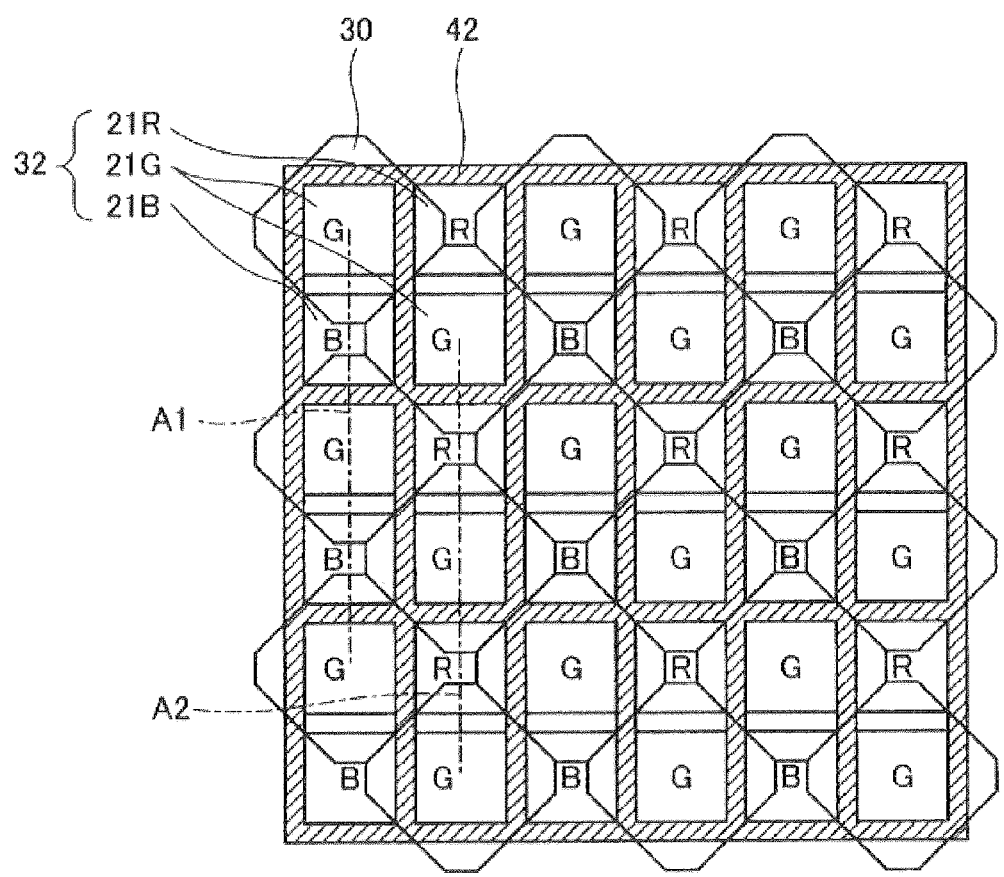
FIG. 11 is a schematic plan view of another embodiment of a micro lens array, a second reflective unit, and a photoelectric conversion element array.

FIG. 9 and FIG. 10 are schematic cross-sectional views of a portion of a solid-state image sensor 40 according to another embodiment. FIG. 11 is a schematic plan view of another configuration of a micro lens array, a second reflection unit, and a photoelectric conversion element array. The same designations are given to the same portions as in the first embodiment, so the explanation is not repeated here for brevity.

FIG. 11 shows a micro lens array when an image sensor 40 as described in FIGS. 9 and 10 is seen from the incidence side, and shows a second reflection unit 42 and photoelectric conversion element array, which are located below the micro lens array. The dashed line A1 represents a straight line that connects the central positions of the photoelectric conversion elements 21G and 21B, which adjoin in the column direction. The dashed line A2 represents a straight line that connects the central positions of the photoelectric conversion elements 21G and 21R, which adjoin in the column direction. The section shown in FIG. 9 corresponds to the dashed line A1 of FIG. 11. The cross-section shown in FIG. 10 corresponds to the dashed line A2 of FIG. 11.

Referring to FIGS. 9 and 10, the image sensor 40 has complementary color filters 41Cy and 41Ye. The complementary color filter 41Cy transmits the cyan (Cy) component of the light emitted from the micro lens 30 and absorbs other components. The complementary color filter 41Cy is a first complementary color filter, which transmits the Cy component containing the G component and the B component. The complementary color filter 41Cy lies between the micro lens array and the third transparent layer 35a, and is provided by corresponding to the photoelectric conversion elements 21G and 21B arranged in parallel in the column direction.

The complementary color filter 41Ye transmits the yellow (Ye) component of the light emitted from the micro lens 30 and absorbs other components. The complementary color filter 41Ye is a second complementary color filter, which transmits Ye component, which is a second complementary color component containing a G component and R component. The complementary color filter 41Ye is between the micro lens array and the third transparent layer 35a, and is provided by corresponding to the photoelectric conversion elements 21G and 21R arranged in parallel in the column direction.

Figure 12:
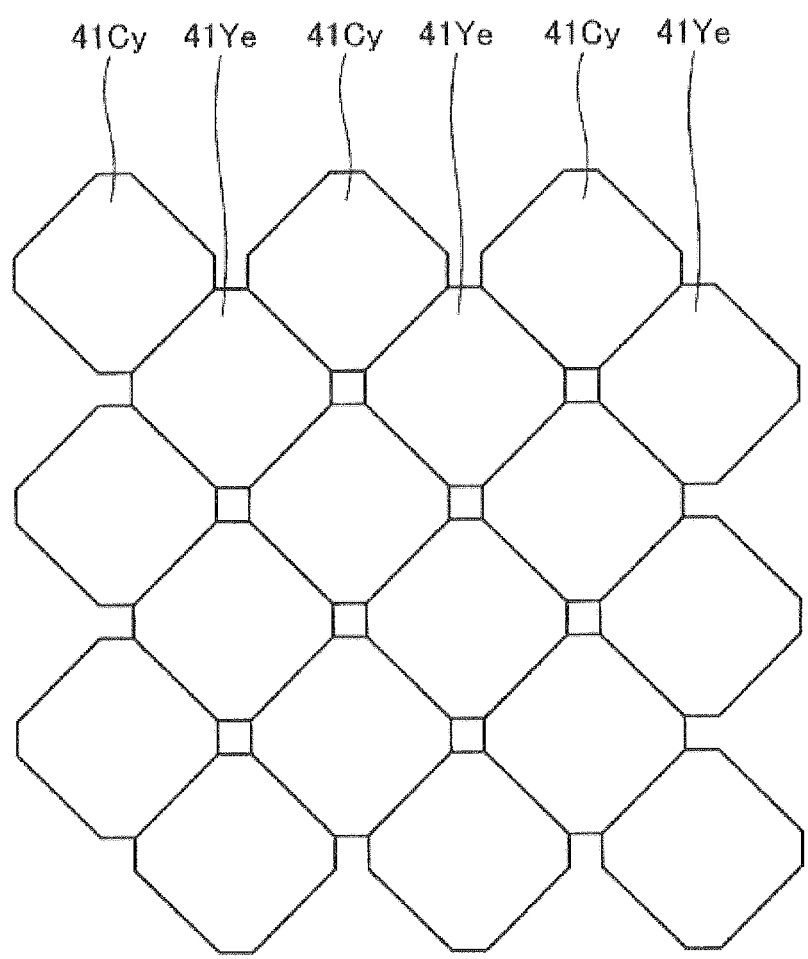
FIG. 12 is a schematic plan view of an embodiment of complementary color filter.

FIG. 12 is a schematic plan view of a complementary color filter. The complementary color filter 41Cy is arranged in the micro lens 30 in the column where the photoelectric conversion elements 21G and 21B are arranged in parallel. The complementary color filter 41Ye is arranged in the micro lens 30 in the column where the photoelectric conversion elements 21G and 21R are arranged in parallel. The column of complementary color filter 41Cy and the column of complementary color filter 41Ye are arranged alternately in the row direction.

The complementary color filters 41Cy and 41Ye are the same shape as the micro lens 30. In addition, the shape of complementary color filters 41Cy and 41Ye can be changed. The complementary color filters 41Cy and 41Ye can be, for example, in the shape of a square with its four corners rounded, a square, a circle, etc., in addition to being in the shape of an octagon. The shape of complementary color filters 41Cy and 41Ye may also be shaped differently from the shape of the micro lens 30.

The configurations shown in FIG. 10 and FIG. 9 are assumed to be similar, except that the arrays of the complementary color filters 41Cy and 41Ye and the photoelectric conversion elements 21R, 21G, and 21B are different. The first reflection unit 25, the second reflection unit 42, and the third reflection unit 27 function as a reflection unit that further reflects the light reflected by the color filters 22R, 22G, and 22B.

The second reflection unit 42 constitutes the second reflective surface, which divides and surrounds the portion corresponding to complementary color filter 41Cy and the portion corresponding to complementary color filter 41Ye of the cells 32. The second reflection unit 42 surrounds the portion under complementary color filter 41Cy and the portion under complementary color filter 41Ye of the first transparent layer 24, respectively.

In the cross-section shown in FIG. 9 and the cross-section shown in FIG. 10, one end of the second reflection unit 42 is joined to the first reflection unit 25. The end of the second reflection unit 42 opposite to the first reflection unit 25 is joined to the separation and reflection unit 23, which separates the portion corresponding to complementary color filter 41Cy and the portion corresponding to complementary color filters 41Ye of the cells 32.

In the cross-section shown in FIG. 9, the second reflection unit 42 forms a side wall that contacts the filter and reflector unit 22B. A sloping eave-like portion is formed on the middle of the side wall. The opposing second reflection unit 42, which contacts the filter and reflector unit 22G, is angled slightly inward toward the lens 31.

In the cross-section shown in FIG. 10, the side wall portion is formed in the upper part from the portion where the filter and reflector unit 22R contacts the second reflection unit 42. A sloping eave-like portion is formed above the middle of the second reflection unit 42 that angles toward the lens 31. The opposing second reflection unit 42, which contacts the filter and reflector unit 22G, is angled slightly toward the lens 31. In addition, in FIG. 11, a portion of the second reflection unit 42 is overhung by the microlens which is primarily focused over the 21G detector of the first reflection unit 32. Additionally, as shown in FIG. 11, although every microlens in the array of microlenses is located in a generally centered location with respect to the detector 21G, each microlens also overhangs portions of at least two, and more commonly four, adjacent reflection units.

The second reflection unit 42 is constituted using components with high reflectivity, for example, metal components such as aluminum, etc., or silicon dioxide ($SiO_2$) with a low optical refractive index. As for the second reflection unit 42, an interface with at least the transparent layer 24 may be configured by a component with high reflectivity. The second reflection unit 42 may be integrated with the first reflection unit 25.

Figure 13:
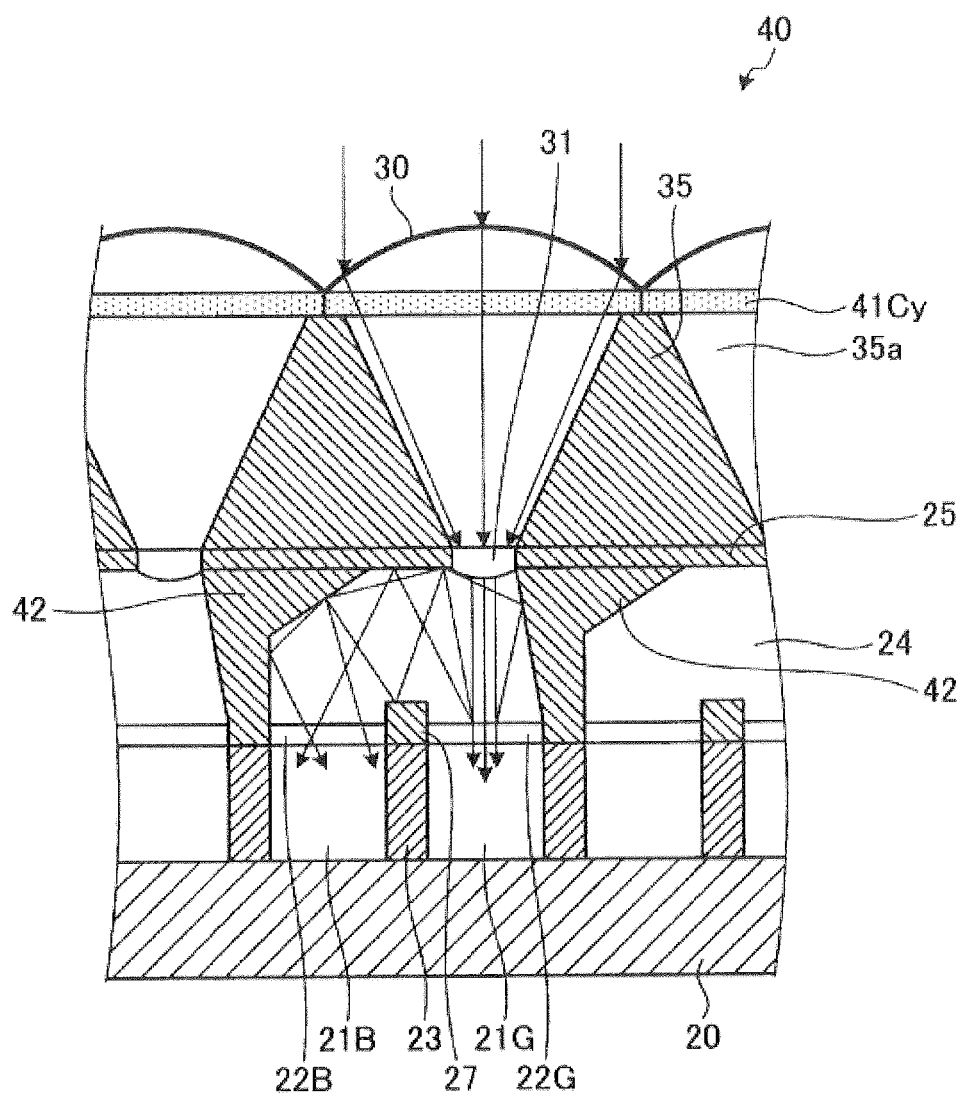
FIG. 13 is a schematic diagram showing an example of the behavior of light that enters the image sensor.

FIG. 13 is a diagram showing an example of the behavior of the incident light in the image sensor 40 shown in FIG. 9. The behavior of the light transmitted by complementary color filter 41Cy is illustrated. The behavior of the light transmitted from complementary color filter 41Ye in the cross-section shown in FIG. 10 may be the same as that of the light transmitted by complementary color filter 41Cy.

The micro lens 30 converges the incident light from the imaging optical system 11 (shown in FIG. 2) towards the inner-layer lens 31. The complementary color filter 41Cy transmits the Cy component of the incident light from the micro lens 30 and absorbs the R component. The light transmitted from the complementary color filter 41Cy passes through the first transparent layer 24 towards the filter and reflector unit 22G, after being transmitted through the inner-layer lens 31. The filter and reflector unit 22G transmits the G component of the incident light and reflects the B component.

The G light transmitted from the filter and reflector unit 22G is changed into an electric charge by the photoelectric conversion element 21G. The light reflected by the filter and reflector unit 22G travels further in the first transparent layer 24. The first reflection unit 25, the second reflection unit 42, and the second reflection unit 27 reflects the incident light and directs it further into the first transparent layer 24. The filter and reflector unit 22B transmits the B component of the incident light and reflects G component. The B light transmitted from the filter and reflector unit 22B is changed into an electric charge by the photoelectric conversion element 21B.

The complementary color filter 41Ye transmits the Ye component of the incident light from the micro lens 30 and absorbs the B component. The light transmitted from the complementary color filter 41Ye passes through the first transparent layer 24 towards the filter and reflector unit 22G, after being transmitted through the inner-layer lens 31. The filter and reflector unit 22G transmits the G component of the incident light and reflects the R component.

The G component of the light transmitted from the filter and reflector unit 22G is changed into an electric charge by the photoelectric conversion element 21G. The light reflected by the filter and reflector unit 22G travels further in the first transparent layer 24. The filter and reflector unit 22R transmits the R component of the incident light and reflects the G component. The R component of the light transmitted from the filter and reflector unit 22R is changed into an electric charge by the photoelectric conversion element 21R.

The second reflection unit 42 efficiently reflects the light from the filter and reflector unit 22G in the direction of the filter and reflector units 22B and 22R by preparing a corresponding slope. In addition, the shape of the second reflection unit 42 may be changed to optimize reflection. The second reflection unit 42 can also include a short reflecting wall, disposed between adjacent detectors 21R, 21G, for example, such as the reflecting wall 27 (see FIG. 1) of the first embodiment.

The image sensor 40 can control the increase of manufacturing costs by adopting the filter and reflector units 22R, 22G, and 22B in the configuration of a color separation unit. The image sensor 40 can make efficient use of incident light by providing the reflection unit corresponding to complementary color filters 41Cy and 41Ye, which surround the first transparent layer 24 in every portion. As with the first embodiment, high-sensitivity photography can be achieved by highly efficient light use and reduction of manufacturing costs made possible by the image sensor 40 of this embodiment.

Figure 14:
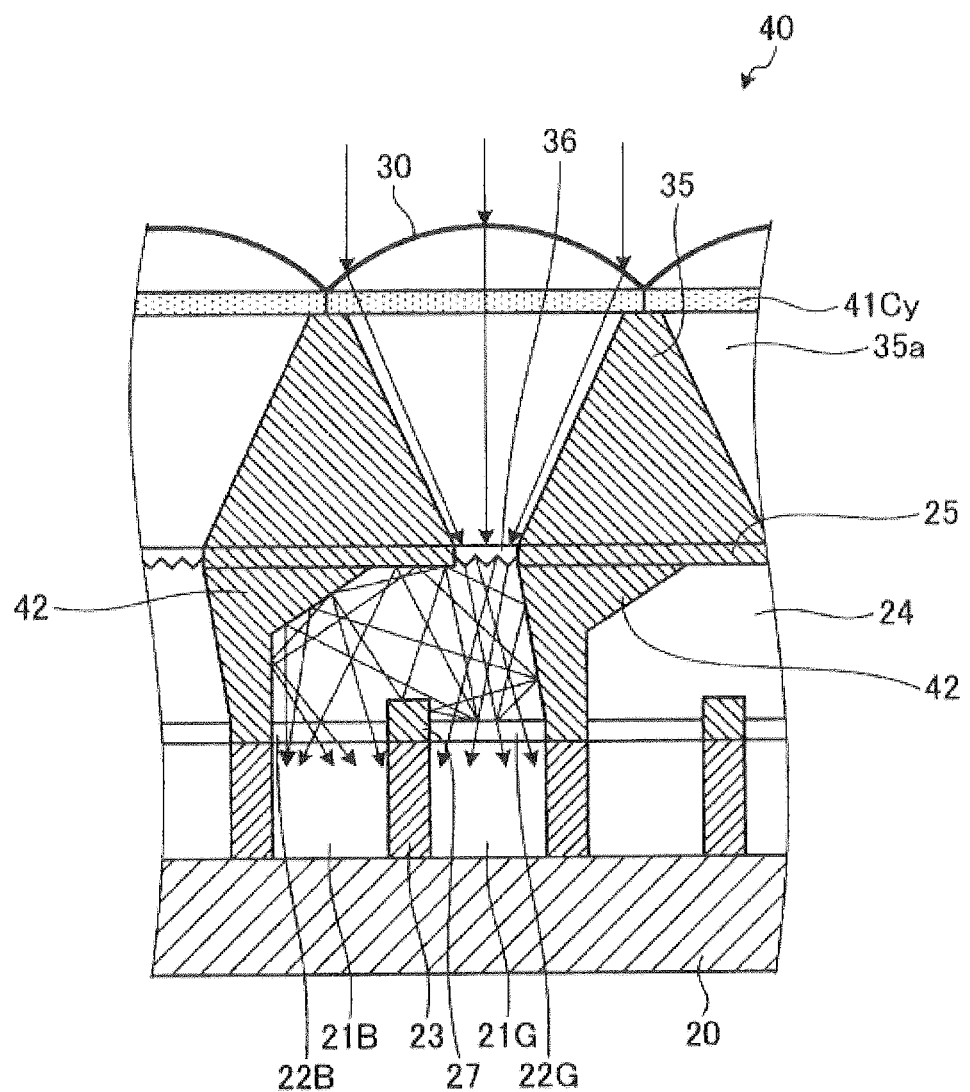
FIG. 14 is a cross-sectional view of a portion of a solid-state image sensor according to another embodiment.

FIG. 14 is a cross-sectional view of a portion of a solid-state image sensor according to another embodiment. The cross-section illustrates a plane that includes the central positions of the photoelectric conversion elements 21G and 21B, which are adjacent to each other. The configuration illustrated is the same cutaway location as that provided in FIG. 13.

The inner-layer lens 31 is replaced with a diffusion unit 36 that is disposed in the opening of the first reflection unit 25. The diffusion unit 36 diffuses the light that condenses from the micro lens 30. The diffusion degree of diffusion unit 36 is set so that light may diffuse within limits that allow the light to be emitted into the filter and reflector unit 22G. For example, the diffusion unit 36 can be made by forming a triangular pyramid structure using titanium dioxide ($TiO_2$) with a high optical refractive index.

The component of light reflected by the filter and reflector unit 22G by light emitted to the filter and reflector unit 22G and diffused in the diffusion unit 36 is further diffused by the filter and reflector unit 22G. Emission of the light through the opening to the third transparent layer 35a side can be controlled in this modification by effectively diffusing the component of light reflected by the filter and reflector unit 22G in a direction away from the opening of the first reflection unit 25.

Figure 15:
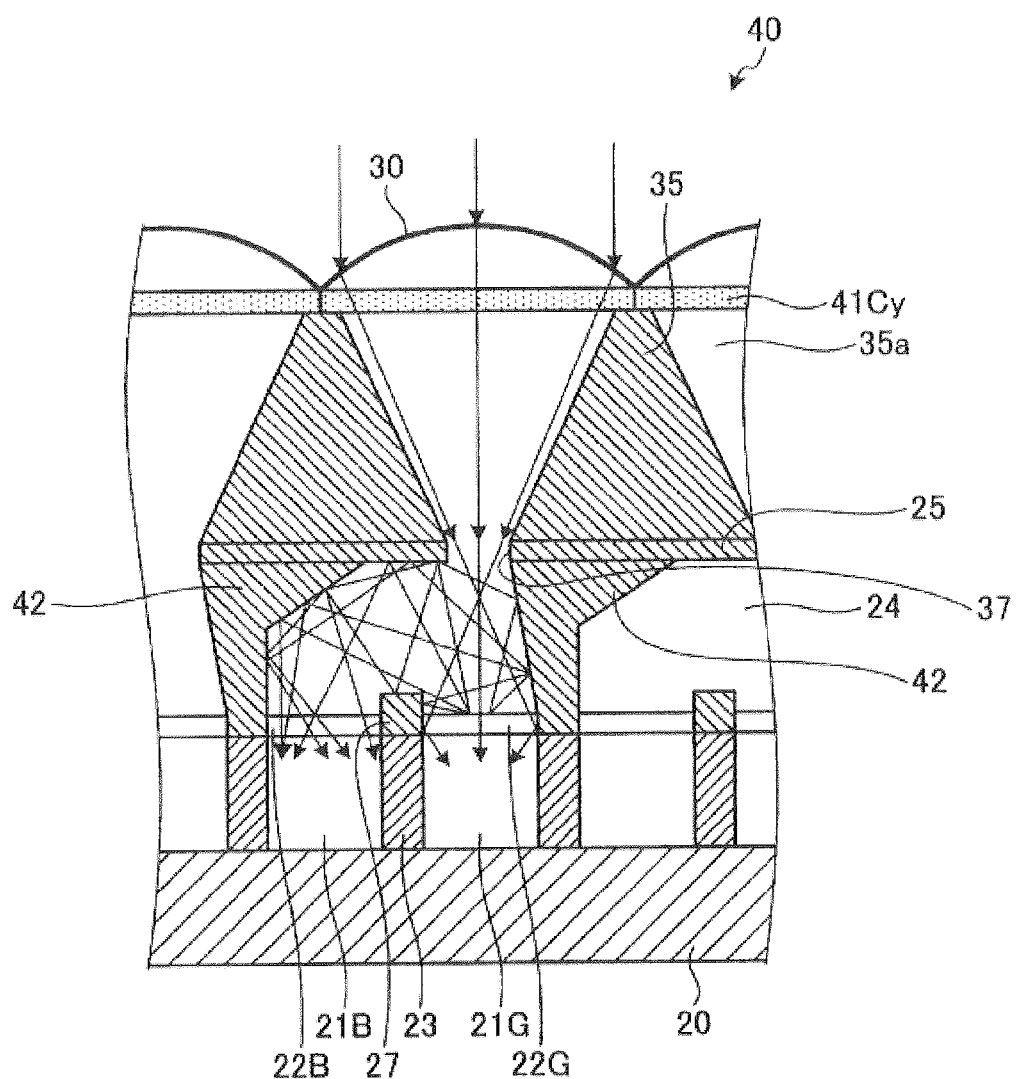
FIG. 15 is a cross-sectional view of a portion of a solid-state image sensor according to another embodiment.

FIG. 15 is a cross-sectional view of a portion of a solid-state image sensor according to another embodiment. The cross-section illustrates a plane that includes the central positions of the photoelectric conversion elements 21G and 21B, which are adjacent to each other. The configuration illustrated is the same cutaway location as that shown in FIG. 13.

The micro lens 30 converges light near the opening 37 of the first reflection unit 25. An optical element need not be positioned in the opening 37. The light that converges in the vicinity of opening 37 is diffused as it is. The condensing degree is set to diffuse the micro lens 30 within limits that allow the light that temporarily converges in the vicinity of opening 37 to be emitted into the filter and reflector unit 22G.

This modification can also effectively diffuse the light of the component reflected by the filter and reflector unit 22G in a direction away from the opening 37, as in the modification shown in FIG. 14, and can control the emission of the light from the opening 37 to the third transparent layer 35a side. Thus, it is possible for the image sensor 40 to reduce the part size, parts count, and cost of the manufacturing process by omitting the optical element in the opening 37.

Figure 16:
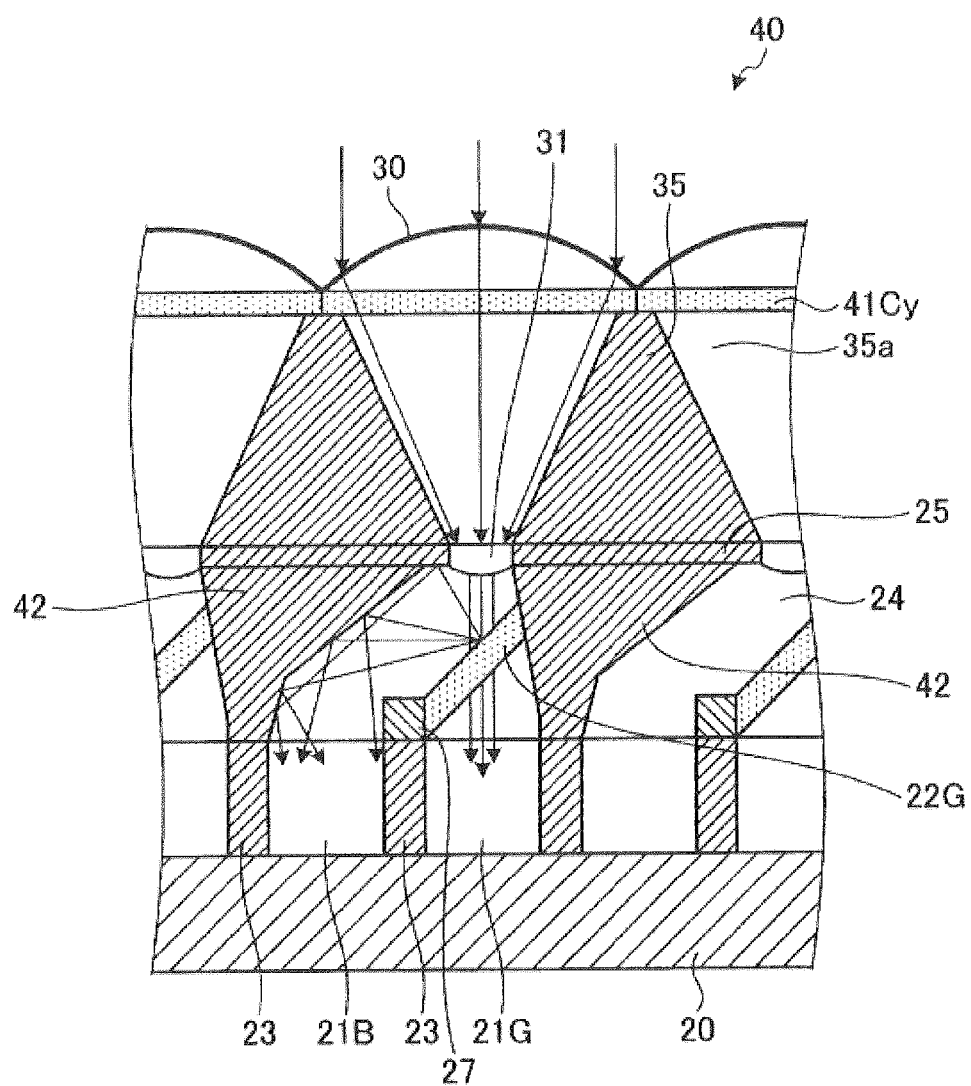
FIG. 16 is a cross-sectional view of a portion of a solid-state image sensor according to another embodiment.
Figure 17:
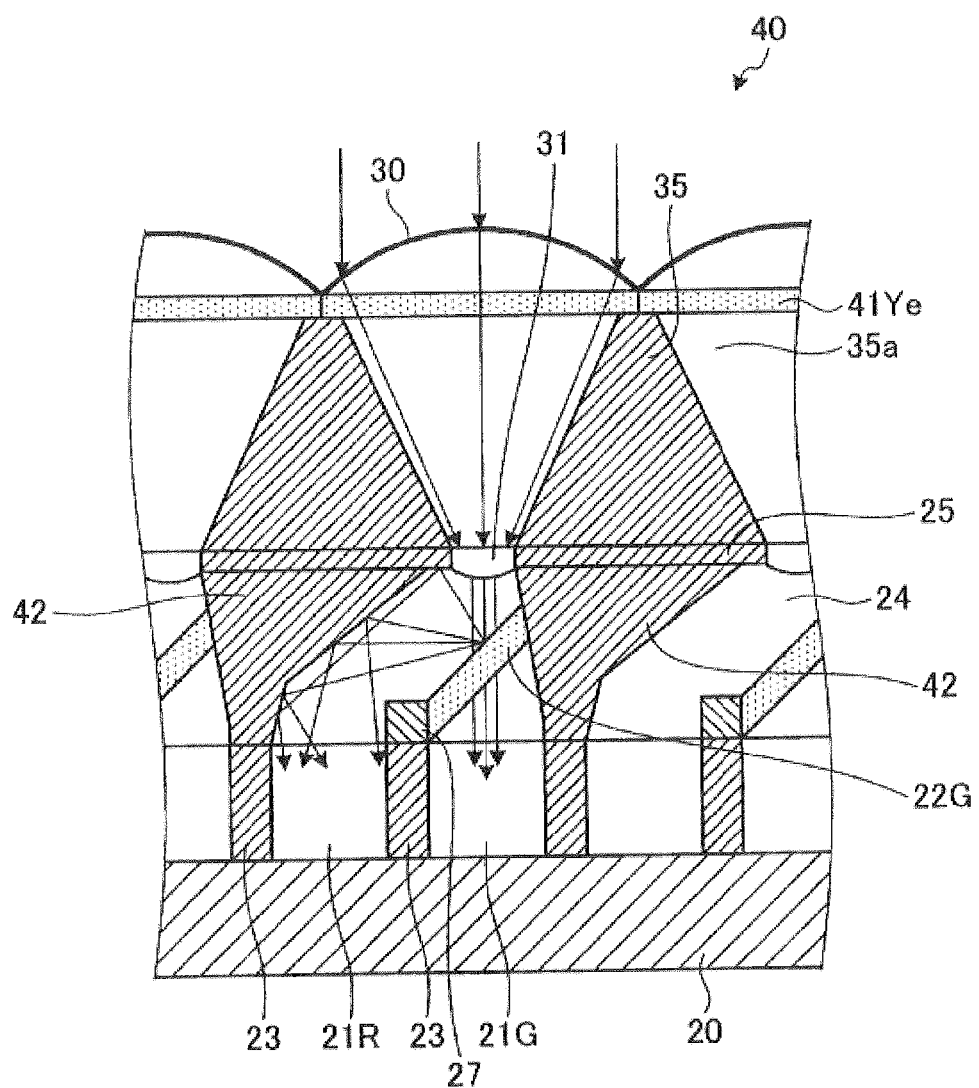
FIG. 17 is a cross-sectional view of a portion of a solid-state image sensor according to another embodiment.

FIG. 16 and FIG. 17 are cross-sectional views of portions of a solid-state image sensor according to another embodiment. The cross-section shown in FIG. 16 illustrates a plane that includes the central positions of the photoelectric conversion elements 21G and 21B, which are adjacent to each other. The cross-section shown in FIG. 17 illustrates a plane that includes the central positions of the photoelectric conversion elements 21G and 21R, which are adjacent to each other.

A filter and reflector unit 22G is arranged in the optical path between the lens inner-layer 31, where the light from complementary color filter 41Cy enters, and the photoelectric conversion element 21G; and between the inner-layer lens 31, where the light from complementary color filter 41Ye is emitted, and the photoelectric conversion element 21G. The filter and reflector unit 22G is angled so that its incident plane is at about a 45-degree angle to the micro lens 30 and the path of incident light that travels to the photoelectric conversion element 21G.

The slope formed above the photoelectric conversion element 21B of the second reflection unit 42 and the slope formed above the photoelectric conversion element 21R are angled in the same angle as the incidence plane of the filter and reflector unit 22G. In this modification, the filter and reflector units 22B and 22R prepared in other image sensors 40 that are described herein are omitted for brevity.

The filter and reflector unit 22G transmits the G component of the incident light from the complementary color filter 41Cy and reflects the B component. The light of the G component transmitted from the filter and reflector unit 22G passes through the first transparent 24 towards the photoelectric conversion element 21G. The light of the B component reflected by the filter and reflector unit 22G travels to the portion that faces the incidence plane of the filter and reflector unit 22G of the second reflection unit 42. The second reflection unit 42 reflects the incident light from the filter and reflector unit 22G downward towards the photoelectric conversion element 21B.

The filter and reflector unit 22G transmits the G component of the incident light from the complementary color filter 41Ye and reflects the R component. The light of the G component transmitted from the filter and reflector unit 22G passes through the first transparent layer 24 towards the photoelectric conversion element 21G. The light of the R component reflected by the filter and reflector unit 22G travels to the portion that faces the incidence plane of the filter and reflector unit 22G of the second reflection unit 42. The second reflection unit 42 reflects the incident light from the filter and reflector unit 22G downward towards the photoelectric conversion element 21R.

In this modification, the filter and reflector unit 22G is sloped and arranged so that it faces the upper portion of the photoelectric conversion element 21B or the upper portion of the photoelectric conversion element 21R via reflection through the second reflection unit 42. The image sensor 40 efficiently advances the light of the R component reflected by the filter and reflector unit 22G and the B component to the photoelectric conversion elements 21B and 21R, respectively.

As a result, it is possible for the image sensor 40 to enhance the light use efficiency. Moreover, it is possible for the image sensor 40 to reduce the part size, parts count, and cost of the manufacturing process by omitting the filter and reflector unit 22B of the light-receiving surface of the photoelectric conversion element 21B and the filter and reflector unit 22R of the light-receiving surface of the photoelectric conversion element 21R.

Although it is possible to use the filter and reflector unit 22G that transmits the G component of the light and reflects the R component and the B component in some embodiments, instead, a filter and reflector unit that transmits the R component and the B component and reflects the G component may be used instead.

In addition, any image sensor 40 explained in this embodiment may omit the fourth reflection unit 35. Moreover, the second embodiment, like the first embodiment, may change correspondingly the configuration of a micro lens array and a photoelectric conversion element array.

While certain embodiments have been described, these embodiments have been presented byway of example only and are not intended to limit the scope of the embodiments. Indeed, the novel embodiments described herein may be embodied in a variety of other forms; furthermore, various omissions, substitutions, and changes in the form of the embodiments described herein may be made without departing from the spirit of the embodiments. The accompanying claims and their equivalents are intended to cover such forms or modifications as would fall within the scope and spirit of the embodiments.

What is claimed is:

1. A solid-state imaging device comprising:
   a photoelectric conversion element array, comprising:
      a first plurality of photoelectric conversion elements to detect energy in a first wavelength range;
      a second plurality of photoelectric conversion elements to detect energy in a second wavelength range different than the first wavelength range; and
      a third plurality of photoelectric conversion elements to detect energy in a third wavelength range that is different than the first and second wavelength range;
   a micro lens array positioned over the photoelectric conversion element array; and
   a wavelength-selective filter and reflector unit positioned between the micro lens array and the photoelectric conversion element array, wherein one of the first plurality of photoelectric conversion elements and at least a portion of one of the second plurality of photoelectric conversion elements comprises a cell, and each cell comprises a first transparent material bounded by a plurality of reflectors that encloses the first transparent material therein, and at least one of the plurality of reflectors has an aperture formed therein for receiving light from the micro lens array.

2. The device of claim 1, wherein the plurality of reflectors comprises a first reflector positioned between the micro lens array and the one of the first plurality of photoelectric conversion elements and the at least one of the second plurality of photoelectric conversion elements.

3. The device of claim 2, further comprising:
   a second transparent layer positioned between the first reflector and the micro lens array.

4. The device of claim 3, wherein the second transparent layer comprises a second reflector that directs light toward the aperture in the first reflector.

5. The device of claim 3, further comprising:
   a color filter disposed between the second transparent layer and the micro lens array.

6. The device of claim 1, wherein the micro lens array comprises a plurality of micro lenses, and each micro lens is centered relative to each of the first plurality of photoelectric conversion elements.

7. The device of claim 6, wherein each micro lens is shaped substantially as an octagon and collects light for the first plurality of photoelectric conversion elements and two of the second plurality of photoelectric conversion elements positioned on opposing sides of the first plurality of photoelectric conversion elements.

8. The device of claim 1, wherein the micro lens array is positioned substantially diagonally relative to the photoelectric conversion element array.

9. The device of claim 1, wherein each cell further comprises a portion of the third plurality of photoelectric conversion elements.

10. The device of claim 9, wherein each cell comprises two of the first plurality of photoelectric conversion elements.

11. The device of claim 1, wherein the wavelength-selective filter and reflector unit comprises a single filter disposed in the first transparent material that is configured to transmit energy in the first wavelength range and reflect energy in the second and the third wavelength ranges.

12. A solid-state imaging device comprising:
a photoelectric conversion element array disposed in a transparent material, the photoelectric conversion element array comprising:
  a first plurality of photoelectric conversion elements to detect energy in a first wavelength range;
  a second plurality of photoelectric conversion elements to detect energy in a second wavelength range different than the first wavelength range; and
  a third plurality of photoelectric conversion elements to detect energy in a third wavelength range that is different than the first and second wavelength range;
a micro lens array positioned over the photoelectric conversion element array;
a first reflector positioned between the micro lens array and one of the first plurality of photoelectric conversion elements and at least one of the second plurality of photoelectric conversion elements, the first reflector having an aperture formed therein for transmitting light from the micro lens array through the transparent layer to the photoelectric conversion element array;
a second reflector coupled to the first reflector and forming a sidewall around the one of the first plurality of photoelectric conversion elements and the at least one of the second plurality of photoelectric conversion elements; and
a wavelength-selective filter and reflector unit positioned between the micro lens array and the photoelectric conversion element array.

13. The device of claim 12, wherein a lens is disposed in the aperture in the first reflector to collimate light from the micro lens array.

14. The device of claim 12, wherein a diffuser is disposed in the aperture in the first reflector to diffuse light from the micro lens array.

15. The device of claim 12, wherein the second transparent layer comprises a second reflector that directs light toward the aperture in the first reflector.

16. The device of claim 15, further comprising:
a color filter disposed between the second transparent layer and the micro lens array.

17. The device of claim 16, wherein the color filter transmits the energy in the first wavelength range and reflects energy in one of the second wavelength range or the third wavelength range.

18. The device of claim 12, wherein the wavelength-selective filter and reflector unit comprises a single filter and reflector unit configured to transmit energy in the first wavelength range and reflect energy in the second and the third wavelength ranges.

19. The device of claim 18, wherein an incident surface of single filter and reflector unit is angled at about a 45 degree angle relative to a surface of the first reflector.

20. A method for manufacturing a solid-state imaging device, comprising:
forming a transparent layer between a microlens array and a photoelectric conversion element array formed in a semiconductor layer, wherein the photoelectric conversion element array comprises, at least, a first photoelectric conversion element, and portions of a second photoelectric conversion element and a third photoelectric conversion element;
forming a first reflector element between the microlens array and the photoelectric conversion element array;
forming a filter and reflector unit between the first reflector element and at least the first photoelectric conversion element;
forming an aperture in the first reflector element; and
forming a second reflector element about the first photoelectric conversion element, and the portions of the second and the third photoelectric conversion elements, to enclose the transparent layer therein.

\* \* \* \* \*